United States Patent
Mollart

(10) Patent No.: US 9,418,833 B2
(45) Date of Patent: Aug. 16, 2016

(54) SYNTHETIC DIAMOND COATED COMPOUND SEMICONDUCTOR SUBSTRATES

(71) Applicant: Element Six Technologies Limited, London (GB)

(72) Inventor: Timothy Peter Mollart, Oxfordshire (GB)

(73) Assignee: Element Six Technologies Limited (GB)

( * ) Notice: Subject to any disclaimer, the term of this patent is extended or adjusted under 35 U.S.C. 154(b) by 0 days.

(21) Appl. No.: 14/362,843

(22) PCT Filed: Dec. 12, 2012

(86) PCT No.: PCT/EP2012/075252
§ 371 (c)(1),
(2) Date: Jun. 4, 2014

(87) PCT Pub. No.: WO2013/087706
PCT Pub. Date: Jun. 20, 2013

(65) Prior Publication Data
US 2014/0339684 A1    Nov. 20, 2014

Related U.S. Application Data

(60) Provisional application No. 61/576,843, filed on Dec. 16, 2011.

(30) Foreign Application Priority Data

Dec. 16, 2011  (GB) .................................. 1121666.0

(51) Int. Cl.
*H01L 21/02* (2006.01)
*C23C 16/27* (2006.01)
(Continued)

(52) U.S. Cl.
CPC ........ *H01L 21/02115* (2013.01); *C23C 16/271* (2013.01); *C23C 16/274* (2013.01);
(Continued)

(58) Field of Classification Search
CPC .. C30B 29/04; C30B 25/02; H01L 21/02527;
H01L 21/02376; H01L 21/02118; H01L 21/02126; H01L 21/02211; H01L 21/02216; H01L 23/3732; H01L 29/1602; H01L 21/02115; H01L 21/02381; H01L 21/02447; H01L 21/02215; H01L 21/02271; H01L 21/02304; H01L 21/0262; H01L 2924/0002
USPC .......... 257/11, 76–77, 189–201, 615, E23.11, 257/E21.001, E21.005, E21.041, E21.049, 257/E21.09–E21.118, E21.603–E21.607; 438/105, 496, 604, 680, 705, 729, 737, 438/758–769, 778–782
See application file for complete search history.

(56) References Cited

U.S. PATENT DOCUMENTS

| | | | |
|---|---|---|---|
| 7,652,282 B2 * | 1/2010 | Yanagihara | ....... H01L 21/02381 257/19 |
| 7,695,564 B1 | 4/2010 | Micovic et al. | |

(Continued)

FOREIGN PATENT DOCUMENTS

| | | |
|---|---|---|
| WO | 2006/100559 A2 | 10/2006 |
| WO | 2006/113539 A2 | 10/2006 |

OTHER PUBLICATIONS

International Search Report for PCT/EP2012/075252 dated Mar. 11, 2013.

(Continued)

*Primary Examiner* — Julio J Maldonado
*Assistant Examiner* — Farun Lu
(74) *Attorney, Agent, or Firm* — Bryan Cave LLP

(57) ABSTRACT

A method of fabricating a synthetic diamond coated compound semiconductor substrate, the method comprising: loading a composite substrate into a chemical vapor deposition (CVD) reactor, the composite substrate comprising a single crystal carrier wafer, a layer of single crystal compound semiconductor epitaxially grown on the carrier wafer, and an interface layer disposed on the layer of compound semiconductor, the interface layer forming a growth surface suitable for growth of synthetic diamond material thereon via a CVD technique; and growing a layer of CVD diamond material on the growth surface of the interface layer, wherein during growth of CVD diamond material a temperature difference at the growth surface between an edge and a center point thereof is maintained to be no more than 80° C., and wherein the carrier wafer has an aspect ratio, defined by a ratio of thickness to width, of no less than 0.25/100.

25 Claims, 6 Drawing Sheets

(51) Int. Cl.
*C30B 29/04* (2006.01)
*C30B 25/10* (2006.01)
*C30B 25/18* (2006.01)
*C23C 16/458* (2006.01)
*H01L 23/373* (2006.01)

(52) U.S. Cl.
CPC ............ *C23C16/4585* (2013.01); *C30B 25/10* (2013.01); *C30B 25/183* (2013.01); *C30B 29/04* (2013.01); *H01L 21/0262* (2013.01); *H01L 21/02271* (2013.01); *H01L 21/02304* (2013.01); *H01L 21/02447* (2013.01); *H01L 21/02527* (2013.01); *H01L 23/3732* (2013.01); *H01L 2924/0002* (2013.01)

(56) References Cited

U.S. PATENT DOCUMENTS

| | | | |
|---|---|---|---|
| 7,939,367 B1* | 5/2011 | Nasser-Faili | H01L 21/02115 257/77 |
| 2002/0050624 A1* | 5/2002 | Vandeputte | C30B 29/06 257/507 |
| 2002/0059905 A1* | 5/2002 | Gorokhovsky | 118/724 |
| 2004/0266055 A1 | 12/2004 | Ravi | |
| 2006/0113545 A1 | 6/2006 | Weber et al. | |
| 2006/0266280 A1* | 11/2006 | Francis | H01L 21/02381 117/68 |
| 2007/0269964 A1 | 11/2007 | Sung | |
| 2008/0203382 A1* | 8/2008 | Yanagihara | 257/194 |
| 2009/0272984 A1 | 11/2009 | Saxler | |
| 2010/0001293 A1 | 1/2010 | Francis et al. | |
| 2010/0155900 A1 | 6/2010 | Korenstein | |
| 2011/0081531 A1 | 4/2011 | Noguchi | |
| 2011/0084285 A1 | 4/2011 | Noguchi | |

OTHER PUBLICATIONS

Search Report for GB1121666.0 dated May 31, 2012.
Search Report for GB1222341.8 dated Mar. 27, 2013.
Virginia Semiconductor, "Your guide to SEMI specifications for Si wafers", (Mar. 3, 2004) Retrieved from Internet: URL:http://www.virginiasemi.com/pdf/semispecificationsoverview71002.pdf.

* cited by examiner

SYNTHETIC DIAMOND COATED COMPOUND SEMICONDUCTOR SUBSTRATES

FIELD OF INVENTION

The present invention relates to the manufacture of substrates for semiconductor devices. In particular, embodiments of this invention relate to synthetic diamond coated compound semiconductor substrates and methods of manufacturing the same.

BACKGROUND OF INVENTION

Optoelectronic, high power, and high frequency devices are increasingly being fabricated using wide band gap compound semiconductor materials such as gallium nitride, aluminium nitride, and silicon carbide. Such semiconductor materials are frequently grown heteroepitaxially in thin film form onto a suitable substrate which provides a lattice matched template for crystal growth. Typical substrates include sapphire, silicon carbide, and silicon. For semiconductor devices such as microwave amplifier circuits, the substrate should be electrically insulating for the device to function.

A well known problem in semiconductor devices is that of heat dissipation. High temperatures often limit the performance and/or lifetime of such devices. This is a particular problem in semiconductor devices which operate at high power and/or high frequency such as microwave amplifiers, power switches and optoelectronic devices. It is therefore desirable to be able to spread any heat generated by component devices to reduce temperatures and thus improve device performance, increase lifetime, and/or increase power density. Accordingly, it is desirable to utilize a substrate material with a high thermal conductivity to spread the heat generated by a device, lowering the power density and facilitating dissipation via a heat sink thus improving device performance, increasing lifetime, and/or enabling an increase in power density.

Diamond has unique properties as a heat spreading material, combining the highest room temperature thermal conductivity of any material, with high electrical resistivity and low dielectric loss when in an intrinsic undoped form. Thus diamond is utilized as a heat spreading substrate for semiconductor components in a number of high power density applications. The advent of large area polycrystalline diamond produced by a chemical vapour deposition (CVD) technique has expanded the applications for diamond heat spreaders via an increase in area and a reduction in cost. A number of the favourable thermal, dielectric and insulating properties of diamond material are not exclusively available in naturally occurring or synthetic single crystal diamond material. Accordingly, polycrystalline CVD diamond wafers have been developed and are commercially available in sizes that enable them to be directly integrated with the fabrication processes of wide band gap semiconductors as a substrate material.

In light of the above, it is evident that for thin film compound semiconductor materials, an ability to integrate diamond as a carrier substrate could greatly improve thermal performance. For high power devices, the challenge is to position an active region of a device in as close proximity as possible to the heat spreading diamond substrate, since any intermediate carrier substrate material such as sapphire, silicon, or silicon carbide acts as a thermal barrier.

Compound semiconductor materials can be grown directly on a polycrystalline diamond substrate using, for example, a metal organic vapour phase epitaxy (MOVPE) technique. However, compound semiconductor material grown in such a manner will itself be polycrystalline, the crystals being distributed over a range of crystallographic orientations relative to the plane of the substrate. Such a polycrystalline layer of compound semiconductor material will tend to have relatively low charge mobility and thus will not provide good device performance for many proposed applications, particularly those which require high charge (electron and/or hole) mobility characteristics such as a high electron mobility transistor (HEMT) used in microwave frequency amplifier circuits. As such, it is desirable to provide a method which allows the provision of a monocrystalline compound semiconductor layer in combination with a polycrystalline diamond layer which functions as a heat spreading substrate. Routes to achieving a composite structure comprising a monocrystalline compound semiconductor layer in combination with a polycrystalline diamond layer may be split into three main categories:

(i) Forming a substrate comprising a monocrystalline compound semiconductor layer, forming a separate substrate comprising a polycrystalline diamond layer, and attaching the two substrates together using an adhesive in order to form a composite structure comprising a monocrystalline compound semiconductor layer in combination with a polycrystalline diamond layer. One problem with this method is that the adhesive used to bond the two substrates together can degrade during use due to heating leading to delamination. A further problem is that common adhesives do not have good thermal conductivity leading to poor thermal contact between the monocrystalline compound semiconductor layer and the polycrystalline diamond layer.

(ii) Growing a layer of monocrystalline compound semiconductor material on a substrate comprising a polycrystalline diamond layer. This may be achieved by forming a polycrystalline diamond layer with a thin layer of monocrystalline material thereon which is suitable for epitaxial growth of a monocrystalline compound semiconductor. For example, a layer of polycrystalline diamond can be grown on a monocrystalline silicon or silicon carbide substrate using a CVD technique. The monocrystalline silicon or silicon carbide substrate can then be processed such that only a thin layer of material remains adhered to the polycrystalline diamond layer. A layer of monocrystalline compound semiconductor material can then be epitaxially grown on the thin layer of monocrystalline silicon or silicon carbide. This results in a composite structure comprising a layer of polycrystalline diamond material, a layer of monocrystalline compound semiconductor material, and a thin intermediate layer of monocrystalline silicon or silicon carbide. The layer of monocrystalline silicon or silicon carbide should be as thin as possible to provide good thermal contact between the monocrystalline compound semiconductor layer and the polycrystalline diamond layer. Prior art documents relevant to this approach include: US 2006/0113545; US 2009/0272984; U.S. Pat. No. 7,695,564; and WO 2006/100559. One problem with this approach is that reducing the thickness of the silicon or silicon carbide wafer can be time consuming and/or difficult to control in order to provide a very thin layer of monocrystalline silicon or silicon carbide over the polycrystalline diamond substrate. Furthermore, the thin layer of monocrystalline silicon or silicon carbide can be subject to polishing damage, cracking, and/or delamination such as via peeling. As such, the quality of moncrystalline compound semiconductor material grown on such a thinned layer can be compromised and/or the intermediate layer is not sufficiently thin as to provide the desired level of thermal contact between the monocrystalline compound semiconductor layer and the polycrystalline diamond layer.

(iii) Growing a polycrystalline diamond layer on a substrate comprising a monocrystalline compound semiconductor material. This may be achieved by epitaxially growing a monocrystalline compound semiconductor material on a suitable carrier substrate such as monocrystalline silicon, silicon carbide, or sapphire. An interface layer can then be grown on the monocrystalline compound semiconductor layer, the interface layer forming a growth surface suitable for growth of synthetic diamond material thereon via a CVD technique. A CVD diamond growth process can then be used to form a layer of polycrystalline diamond material over the interface layer. This results in a composite structure comprising a layer of polycrystalline diamond material, a thin intermediate layer which may be, for example, silicon nitride, aluminium nitride, or silicon carbide, a layer of monocrystalline compound semiconductor material, and a layer corresponding to the original carrier substrate on which the monocrystalline compound semiconductor material was grown. The layer corresponding to the original carrier substrate may be partially or wholly processed off during further fabrication steps to yield a semiconductor device component. As before, the intermediate layer should be sufficiently thin to provide good thermal contact between the monocrystalline compound semiconductor layer and the polycrystalline diamond layer. Prior art documents relevant to this approach include: U.S. Pat. No. 7,939,367; US 2006/0266280; and US 2010/0001293. One problem with this approach is that thermal loading of the compound semiconductor substrate during CVD diamond growth thereon can damage the compound semiconductor material and/or result in the substrate warping (plastically deforming) on cooling which impairs the performance of the semiconductor substrate when incorporated into a semiconductor device.

Embodiments of the present invention are concerned with the approach outlined in point (iii) above and particularly directed to solving the problems associated with warping of the compound semiconductor substrate. In this regard, U.S. Pat. No. 7,939,367 describes that the problem of substrate warping is due to temperature gradients across the substrate during CVD diamond growth thereon. It is described that the temperature difference between an edge and a centre of the substrate may be maintained within 80° C. by controlling the power ramping rate during CVD diamond growth of at least the initial layer of CVD diamond material. However, the present inventors have found that even if the power ramping rate is controlled in the described manner, warping and plastic deformation of compound semiconductor substrates is still problematic. This problem is exacerbated if the CVD diamond material grown thereon is grown under conditions suitable to obtain good CVD diamond growth rates and/or good quality polycrystalline CVD diamond material which has very high thermal conductivity.

In light of the above, it is an aim of certain embodiments of the present invention to address these problems.

SUMMARY OF INVENTION

A first aspect of the present invention provides a method of fabricating a synthetic diamond coated compound semiconductor substrate, the method comprising:
loading a composite substrate into a chemical vapour deposition (CVD) reactor, the composite substrate comprising a single crystal carrier wafer, a layer of single crystal compound semiconductor epitaxially grown on the carrier wafer, and an interface layer disposed on the layer of compound semiconductor, the interface layer forming a growth surface suitable for growth of synthetic diamond material thereon via a CVD technique; and
growing a layer of CVD diamond material on the growth surface of the interface layer,
wherein during growth of CVD diamond material a temperature difference at the growth surface between an edge and a centre point thereof is maintained to be no more than 80° C., and
wherein the carrier wafer has an aspect ratio, defined by a ratio of thickness to width, of no less than 0.25/100.

A second aspect of the present invention provides a composite structure comprising:
a layer of synthetic polycrystalline CVD diamond material having a thickness no less than 40 µm;
an interface layer disposed on the layer of synthetic polycrystalline CVD diamond material; and
a layer of single crystal compound semiconductor disposed on the interface layer, the layer of single crystal compound semiconductor having a thickness no less than 0.01 µm,
wherein the interface layer has a thickness no more than 15 µm,
wherein the layer of synthetic polycrystalline CVD diamond material has a thermal conductivity of at least 600 $Wm^{-1}K^{-1}$, and wherein the layer of single crystal compound semiconductor has a charge mobility no less than 1000 $cm^2V^{-1}s^{-1}$.

The present inventors have found that the mechanical stiffness of a single crystal compound semiconductor substrate must be sufficiently large to prevent plastic deformation when a CVD diamond layer is grown thereon. The present inventors have found that the required level of mechanical stiffness can be achieved by providing the single crystal semiconductor material on a carrier wafer which is relatively thick (compared with its lateral width). Otherwise, even if the temperature across the growth surface is controlled to vary by no more than 80° C., plastic deformation of the single crystal semiconductor material still occurs.

Certain embodiments also use active temperature control to ensure that the temperature across the growth surface is controlled to vary by no more than 80° C., and preferably much less. The present inventors consider that even if the power ramping rate is controlled as described in U.S. Pat. No. 7,939,367, and even if the semiconductor is provided on a thick carrier substrate as described above in accordance with the first aspect of the present invention, warping and plastic deformation of compound semiconductor substrates can still be problematic when operating under high pressure and/or high power density CVD diamond growth conditions. High pressure and power density CVD diamond growth conditions are advantageous to obtain good CVD diamond growth rates and/or good quality polycrystalline CVD diamond material which has very high thermal conductivity. However, such conditions are more problematic in causing plastic deformation of compound semiconductor substrates. As such, the present inventors have developed active temperature control configurations which allow such CVD diamond growth conditions to be utilized while still avoiding the problem of plastic deformation in the compound semiconductor substrate.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

As previously described, embodiments of the present invention are based on the realization that a combination of temperature control and substrate rigidity are required in order to eliminate the problem of plastic deformation in compound semiconductor substrates when a CVD diamond layer is grown thereon, particularly when the CVD diamond layer is grown at high pressure/high power conditions to achieve a commercially viable process.

Figure 1:
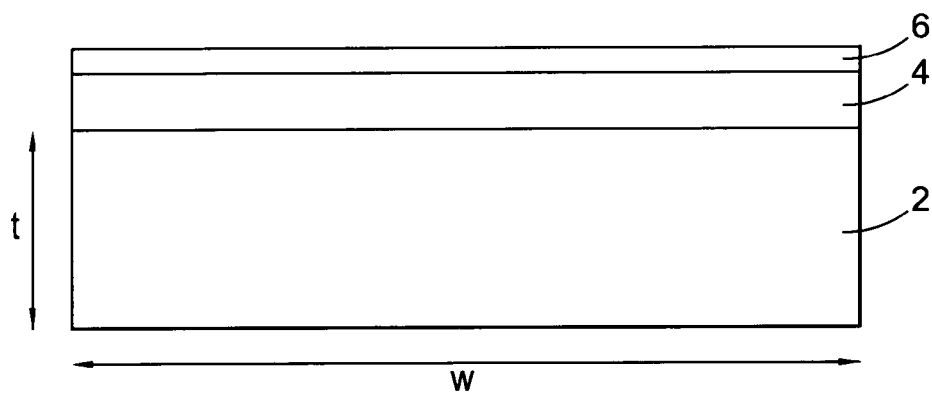
FIG. 1 illustrates a composite substrate comprising a single crystal carrier wafer, a layer of single crystal compound semiconductor epitaxially grown on the carrier wafer, and an interface layer disposed on the layer of compound semiconductor, the interface layer forming a growth surface suitable for growth of synthetic diamond material thereon via a CVD technique.

In light of the above, certain embodiments of the present invention provide a composite substrate as illustrated in FIG. 1. The composite substrate comprising a single crystal carrier wafer 2, a layer of single crystal compound semiconductor 4 epitaxially grown on the carrier wafer 2, and an interface layer 6 disposed on the layer of compound semiconductor 4, the interface layer 6 forming a growth surface suitable for growth of synthetic diamond material thereon via a CVD technique.

Figure 2:
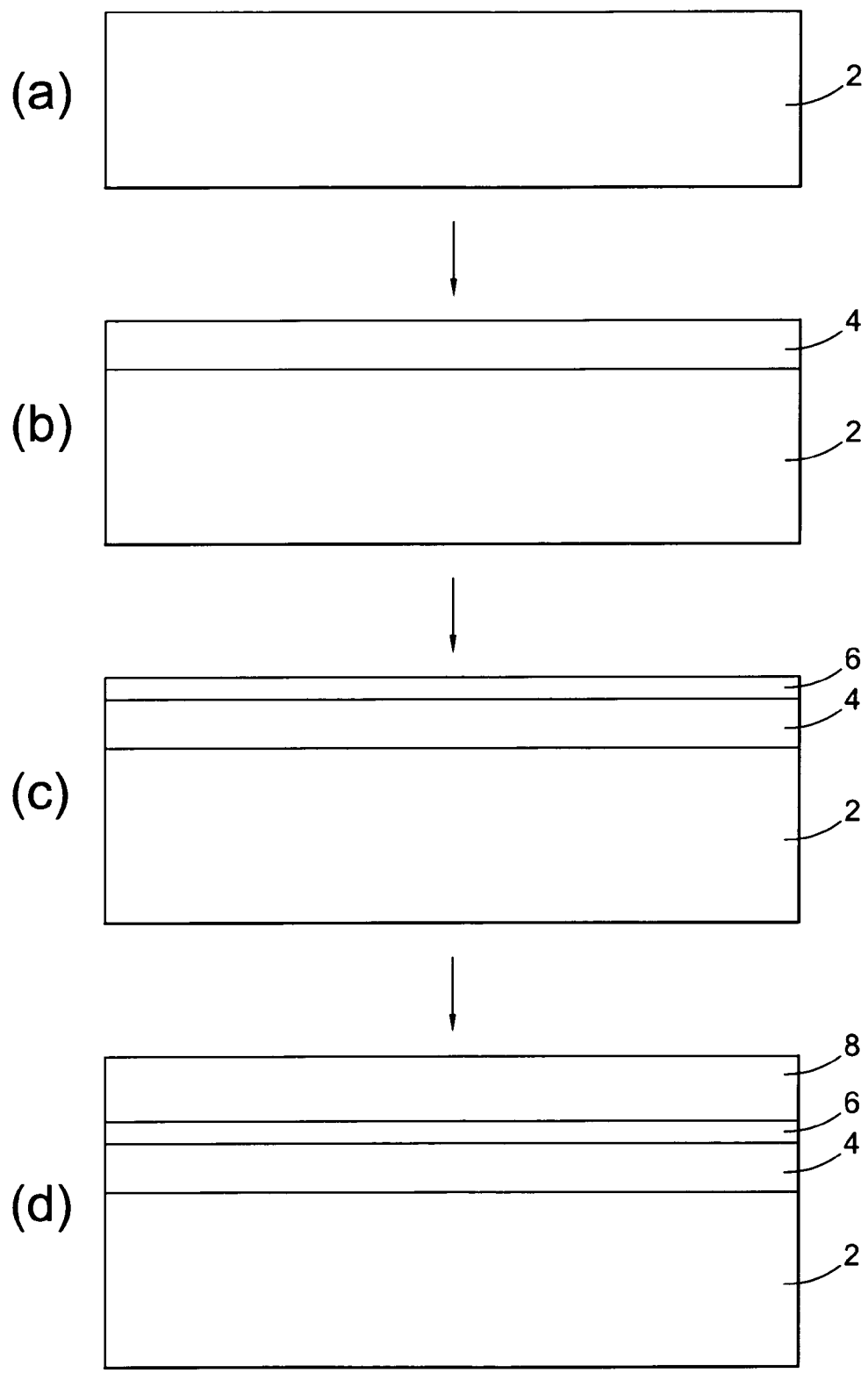
FIG. 2 illustrates method steps involved in fabricating a synthetic diamond coated compound semiconductor substrate.

FIG. 2 illustrates method steps involved in fabricating a synthetic diamond coated compound semiconductor substrate. In FIG. 2(a) a single crystal carrier wafer 2 is provided. In FIG. 2(b) a layer of single crystal compound semiconductor 4 is epitaxially grown on the carrier wafer 2. In FIG. 2(c) an interface layer 6 is deposited on the layer of compound semiconductor 4. In FIG. 2(d) a synthetic diamond layer 8 is grown on the interface layer 6 using a CVD technique.

The carrier wafer 2 has an aspect ratio, defined by a ratio of thickness t to width w, of no less than 0.25/100, 0.30/100, 0.40/100, 0.50/100, 0.60/100, 0.70/100, 0.80/100, 0.90/100, or 1.0/100. Such a carrier wafer adds sufficient rigidity to the composite substrate so as to eliminate the problem of plastic deformation in the compound semiconductor layer when subjected to a CVD diamond growth process. However, if the carrier wafer becomes too thick then this adds significant expense. As such, in practice the carrier wafer has an aspect ratio no more than 10/100, 8/100, 6/100, 4/100, or 2/100.

For example, the width w of the carrier wafer may be no less than 50 mm, 70 mm, 90 mm, 110 mm, 130 mm, 150 mm, 170 mm, 190 mm, 210 mm, 230 mm, 250 mm, 300 mm, 400 mm, or 500 mm. Furthermore, the thickness t of the carrier wafer may be no less than 225 µm, 475 µm, 600 µm, 725 µm, 850 µm, 975 µm, 1.2 mm, or 1.45 mm. Taking commercial considerations into account and ease of growing diamond material of high quality over large areas, the width of the carrier wafer may be no more than 700 mm, 600 mm, 500 mm or 400 mm. Furthermore, the thickness of the carrier wafer may be no more than 30 mm, 20 mm, 10 mm, or 5 mm.

If the carrier wafer is in the form of a cylindrical disk then the width w is equivalent to the diameter of the cylindrical disk. In this regard, it is noted that cylindrical carrier wafers often include a flat portion which may be used to indicate crystallographic orientation. As such, the term cylindrical here is intended to include disks which are substantially cylindrical but include a flat portion. In this case, if present the flat portion preferably corresponds to no more than 10%, 7%, 5%, 3%, 2%, 1%, or 0.01% of the area of the disk. For non-cylindrical carrier wafers the width w may be taken at the longest lateral dimension perpendicular to the thickness t.

The specific thickness and width of carrier wafer will depend to some extent on the type of material used to fabricate the carrier substrate. The carrier wafer is advantageously formed of a material having a yield stress at room temperature no less than 50 MPa, 75 MPa, 100 MPa, 150 MPa, 200 MPa, 250 MPa, 300 MPa, 350 MPa, or 400 MPa. However, it should be noted that the yield stress of a material is temperature dependent and can be much reduced at the temperatures used for CVD diamond growth. As such, the carrier wafer is advantageously formed of a material having a yield stress at a CVD growth temperature of no less than 10 MPa, 20 MPa, 50 MPa, 75 MPa, 100 MPa, 150 MPa, 200 MPa, or 300 MPa.

In addition to the above, it should also be noted that the magnitude of stress imparted on a substrate when subjected to CVD diamond growth is dependent on the thermal expansion coefficient of the substrate material. Diamond has an extremely low thermal expansion coefficient of $1 \times 10^{-6}$ $K^{-1}$ at 20° C. Accordingly, a significant mismatch in the thermal expansion coefficient of the CVD diamond material and the material of the underlying substrate leads to stress build up in the CVD diamond material and the substrate during cooling. This can cause cracking in one or more of the layers, delamination of the layers, and/or plastic deformation. Accordingly, it can be advantageous to provide a carrier wafer formed of a material having a relatively low thermal expansion coefficient such that the thermal mismatch with the CVD diamond material is not too large and the yield stress of the substrate is not exceeded. For example, the carrier wafer may be formed of a material having a coefficient of linear thermal expansion α no more than $6 \times 10^{-6}$ $K^{-1}$, $5.5 \times 10^{-6}$ $K^{-1}$, $5.0 \times 10^{-6}$ $K^{-1}$, $4.0 \times 10^{-6}$ $K^{-1}$, $3.0 \times 10^{-6}$ $K^{-1}$, or $2.8 \times 10^{-6}$ $K^{-1}$ at 20° C.

In addition to the above, the carrier wafer should be monocrystalline and made of a material suitable to epitaxially grow the compound semiconductor layer thereon. Examples of suitable materials include silicon, silicon carbide, and sapphire.

For example, in a CVD diamond growth process according to certain embodiments of the present invention it has been found that for a silicon carrier wafer the minimum thickness in a 100 mm diameter process is 500 µm, i.e. an aspect ratio of 0.5 mm/100 or 1:200. For a 50 mm diameter process the minimum thickness is 250 µm and for a 150 mm diameter process the minimum thickness is 750 µm. The yield stress of silicon is strongly temperature dependent, going from approximately 100 MPa at room temperature to approximately 10 to 20 MPa at 600° C. to 800° C.

Silicon carbide and sapphire are both stiffer than silicon at room temperature (around 400 MPa) and at elevated temperature suggesting that thinner carrier substrates could be used. However, the thermal expansion coefficient of the materials also needs to be taken into account as previously described. For example, silicon and silicon carbide have a coefficient of linear thermal expansion α of approximately $3 \times 10^{-6}$ $K^{-1}$ at 20° C. whereas sapphire has a coefficient of linear thermal expansion α of approximately $5 \times 10^{-6}$ $K^{-1}$ at 20° C. As such, the higher yield stress of sapphire is off-set to some extent by its higher thermal expansion coefficient. Accordingly, the aspect ratios as previously defined are applicable to all these materials.

If a carrier wafer as described above is used to support the compound semiconductor layer and provide the required rigidity, it is possible to utilize a relatively thin high quality layer of compound semiconductor material suitable for device applications. For example, the layer of single crystal compound semiconductor may have a thickness in a range 0.01 to 100 µm, 0.01 to 50 µm, 0.01 to 10 µm, 0.01 to 5 µm, 0.05 to 3 µm, or 0.1 to 2 µm. Preferably the layer of single crystal compound semiconductor is formed of a compound semiconductor comprising group III and group V elements. A particularly preferred example for high power electronic applications is gallium nitride.

The interface layer may be any material which provides a suitable growth surface for CVD deposition of polycrystalline diamond material and provides a good bonding interface between the compound semiconductor material and the CVD diamond material. Examples include one or more layers of silicon nitride, aluminium nitride, or silicon carbide. The interface layer should be sufficiently thick to provide a coherent layer with a high quality surface finish so as to provide the bonding and adhesion requirements. However, if the interface layer is made too thick then this detrimentally affects the thermal contact between the CVD diamond material and the compound semiconductor material. As such, the interface layer should be made sufficiently thin to ensure that it doesn't present a significant barrier to heat flow from the compound semiconductor material into the CVD diamond material. For example, the interface layer may have a thickness no more than 15 µm, 10 µm, 5 µm, 3 µm, 1 µm, 100 nm, 50 nm, 20 nm, 10 nm, or 5 nm. Depending on the technique used to fabricate and process the interface layer to form the growth surface, the interface layer may have a thickness no less than 1 nm, 5 nm, 10 nm, 20 nm, 30 nm, or 50 nm.

The interface layer may be processed to provide a high quality surface finish so as to provide the bonding and adhesion requirements as mentioned above. For example, the surface roughness can affect both the growth of the polycrystalline CVD diamond material and the adhesion of the polycrystalline CVD diamond layer. As such, the growth surface of the interface layer may be processed to have a surface roughness $R_a$ in the range 1 nm to 1 µm, 1 nm to 500 nm, 10 nm to 500 nm, 10 nm to 200 nm, or 10 nm to 100 nm. Furthermore, the growth surface may be processed to a high degree of flatness in order to avoid non-uniform stress build-up leading to plastic deformation of the compound semiconductor. For example, the growth surface of the interface layer may be processed to have a surface flatness variation no more than 100 µm, 75 µm, 50 µm, 40 µm, 30 µm, 20 µm, 10 µm, 5 µm, or 1 µm.

In relation to the above, surface roughness is a measure of the texture of a surface. It is quantified by the vertical deviations of a real surface from its ideal form. Roughness is typically considered to be the high frequency, short wavelength component of a measured surface and is measured using a roughness parameter, there are several formula that can be used, the most common is the average roughness or $R_a$ defined as:

$$R_a = \frac{1}{n} \sum_{i=1}^{n} |y_i|$$

Where the roughness profile contains n ordered, equally spaced points along the trace, and $y_i$ is the vertical distance from the mean line to the $i^{th}$ data point. Height is assumed to be positive in the up direction, away from the bulk material. Using a profileometer the $R_a$ is typically measured over five roughly equally spaced 1.25 mm sections on the substrate surface.

Flatness is a measure of the height variation from the reference plane over the sample surface. The simplest measurement is to use an appropriate measurement instrument, e.g. a micrometer to measure height from a reference plane flat surface. For cylindrical components a roundness tester, where the reference surface can be rotated over a stationary measurement tip and the displacement recorded can be used to measure the height deviation of a defined circumference. In addition, high precision metrology instruments such as coordinate measuring machines having a resolution of about 1 µm are typical. None contact techniques such as optical interferometry offer very high precision measurements of flatness with resolution of about 10 nm.

The relative thicknesses of the carrier wafer and the CVD diamond layer can also be important to provide a composite structure which is not plastically deformed after CVD diamond growth. If the CVD diamond layer is made too thick relative to the carrier wafer, then the carrier wafer can break or the semiconductor material can plastically deform during CVD growth of the diamond layer on the composite substrate. Conversely, if the carrier wafer is made too thick relative to the diamond layer, then the diamond layer can break during CVD growth of the diamond layer on the wafer. For example, a ratio of CVD diamond layer thickness to carrier wafer thickness may lie in a range 0.03 to 1.5, 0.05 to 1.3, 0.1 to 1.0, or 0.3 to 0.7. Typically, the layer of CVD diamond material is grown to a thickness in the range: 50 µm to 150 µm; 70 µm to 130 µm; 80 µm to 120 µm, or 90 µm to 110 µm. Such a layer thickness is sufficient to provide good thermal management. Furthermore, it has been found to be possible to grow such layer thicknesses while avoiding plastic deformation or cracking of the composite substrate layers.

In addition to the aforementioned requirements for the composite substrate structure, it has also been found to be useful to provide a composite substrate which has a highly flat rear surface. For example, the carrier wafer may be processed to have a rear surface flatness variation no more than 100 µm, 75 µm, 50 µm, 40 µm, 30 µm, 20 µm, 10 µm, 5 µm, or 1 µm.

Furthermore, the composite substrate as a whole may have a thickness variation no more than 200 µm, 150 µm, 100 µm, 80 µm, 60 µm, 40 µm, 20 µm, 10 µm, or 2 µm. In this regard, it has been found that the flatness of the composite substrate surfaces can affect the temperature of the composite substrate during CVD growth. As such, it has been surprisingly found that the composite substrate must be processed to a very high degree of flatness in order to avoid temperature variations across the substrate. The reasons for this relate to how a substrate temperature control system interacts with the composite substrate and are discussed in more detail later.

Figure 3:
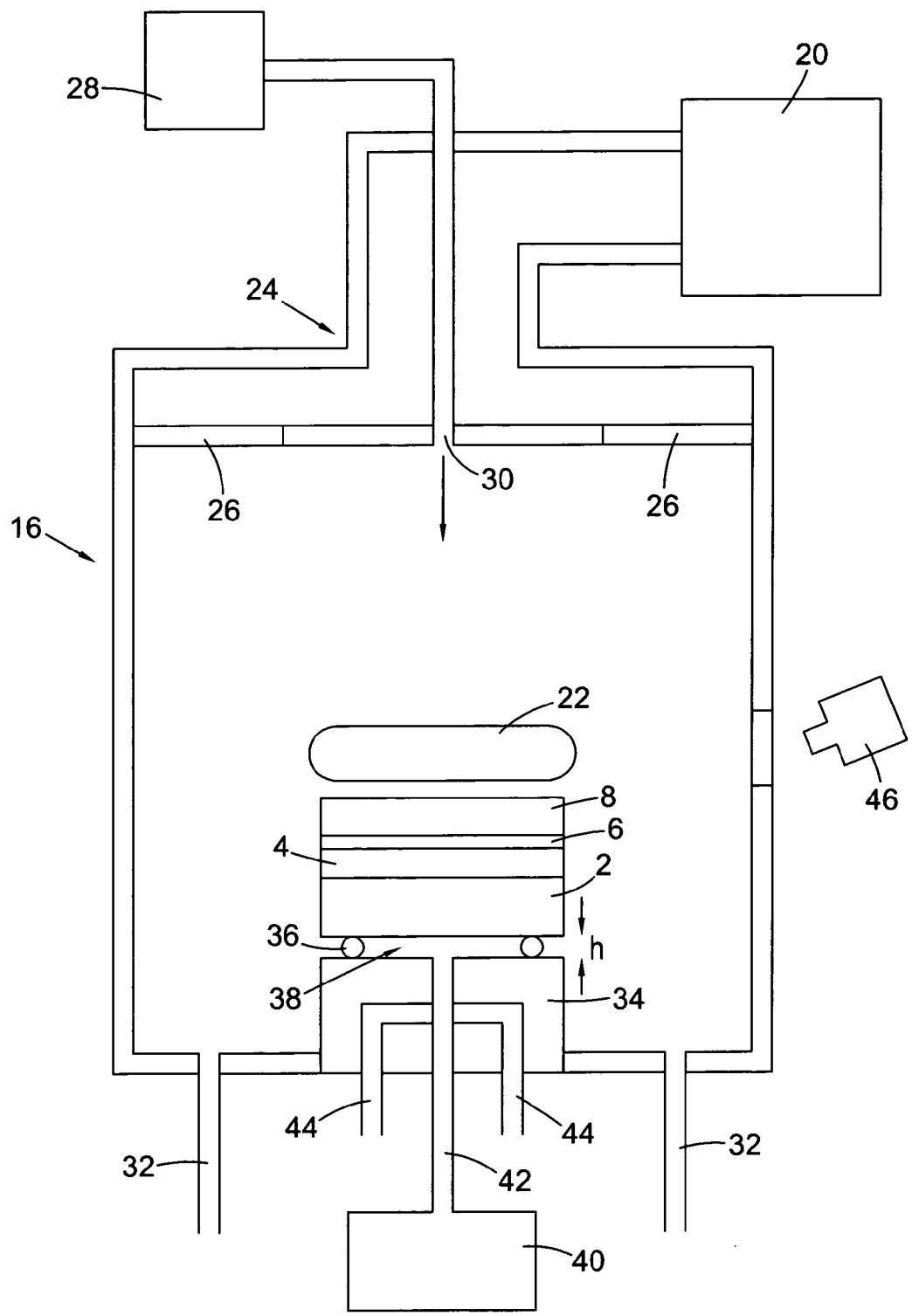
FIG. 3 illustrates a microwave plasma reactor for synthesis of CVD diamond material which comprises a substrate mounting stage and temperature control system used in combination with a composite substrate as illustrated in FIG. 1 for achieving precise control of the temperature across the growth surface of the composite substrate during the CVD diamond synthesis process.

FIG. 3 shows an example of a microwave plasma reactor comprising a temperature monitoring system and substrate temperature control system. The microwave plasma reactor comprises the following basic components: a plasma chamber 16; a substrate holder 34; a substrate configuration 2, 4, 6 as previous illustrated in FIG. 1 on which CVD diamond material 8 is grown; a microwave generator 20 for forming a plasma 22 within the plasma chamber 16; a microwave coupling configuration 24 for feeding microwaves from the microwave generator 20 into the plasma chamber 16 via dielectric windows 26; and a gas flow system comprising source gases 28, one or more gas inlets 30, and one or more gas outlets 32 for feeding process gases into the plasma chamber 16 and removing them therefrom.

The plasma chamber is configured to form a resonance cavity supporting a standing microwave in use. According to one configuration the plasma chamber is configured to support a $TM_{01n}$ standing microwave in use, e.g. a $TM_{011}$ mode. The operational frequency may be in a range 400 to 500 MHz, 800 to 1000 MHz, or 2300 to 2600 MHz. Source gases including a carbon source and molecular hydrogen are fed into the plasma reactor vessel and can be activated by the standing microwave to form a plasma in high electric field regions. The substrate configuration is provided in close proximity to the plasma such that reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

The carrier wafer 2 is spaced apart from a substrate holder 34 by spacer wires or spacer pads 36 to define a gas gap 38 between a supporting surface of the substrate holder 34 and a rear surface of the carrier wafer 2. The height h of the gas gap may be in the range 25 µm to 2000 µm, 50 µm to 1000 µm, or 100 µm to 750 µm depending on the specific synthesis conditions. Furthermore a gas supply system 40 is coupled to the gas gap 38 via a supply pipe 42 which extends from the gas supply system 40 through the substrate holder 34 and is configured to supply gas into the gas gap 38 through one or more outlets in the supporting surface of the substrate holder 34. A coolant liquid supply system 44 is also provided for cooling the substrate holder 34.

It should also be noted that while the microwave plasma reactor illustrated in FIG. 3 has a separate substrate holder 34 disposed in the plasma chamber, the substrate holder may be formed by the base of the plasma chamber 16. The use of the term "substrate holder" is intended to cover such variations. Furthermore, the substrate holder may comprise a flat supporting surface which is the same diameter (as illustrated) or larger than the composite substrate 2, 4, 6. For example, the substrate holder may form a large flat surface, formed by the chamber base or a separate component disposed over the chamber base, and the substrate may be carefully positioned on a central region of the flat supporting surface. In one arrangement, the flat supporting surface may have further elements, for example projections or grooves, to align, and optionally hold, the substrate. Alternatively, no such additional elements may be provided such that the substrate holder merely provides a flat supporting surface over which the substrate is disposed.

The coolant liquid supply system 44 provides a rough basic cooling to the substrate holder 34. However, this system can be insufficiently precise for fine temperature control of the substrate. Accordingly, the gas supply system 40, 42 is provided in order to allow more precise control of the substrate temperature. The gas supply system 40, 42 may be configured to inject at least two gases having different thermal conductivities into the gas gap below the substrate and vary a ratio of the at least two gases in order to control the temperature of the substrate on the substrate holder. For example, the gas supply system may utilize a mixture of a light gas such as hydrogen and a heavy gas such as argon which is less thermally conductive. Advantageously, the gases used to control the temperature of the substrate are ones which are also utilized in the main process chemistry so that additional gas sources are not required. If an edge temperature of the substrate is too high relative to a central region of the support substrate, the proportion of heavy gas relative to light gas can be increased to reduce the thermal conductivity of the gas under a central region of the substrate, thus causing the central region of the substrate to heat up relative to the edge of the substrate. Conversely, if the edge temperature of the substrate is too low relative to the central region of the support substrate, the proportion of light gas relative to heavy gas can be increased to increase the thermal conductivity of the gas under a central region of the support substrate, thus causing the central region of the substrate to cool down relative to the edge of the substrate. The absolute temperature of the substrate as well as the relative temperature of different regions of the substrate can also be controlled by varying gas flow and gas composition within the gas gap under the substrate.

The spacer wires 36 may be configured to define a central gas gap cavity under the substrate so that the gas pools in the central gas gap cavity. The spacer wires may each be arcuate in shape and configured into a ring with gaps therebetween through which the gas can flow.

The microwave plasma reactor further comprises one or more temperature measurement devices 46 configured to take at least two temperature measurements, including one or more measurements in a central region of the substrate and one or more measurements in a peripheral region of the substrate. The temperature measurements may be taken simultaneously or within a short time interval of each other and the substrate temperature control system may be used to correct any temperature variations. The temperature measurement device may comprise a pyrometer 46 as illustrated in FIG. 3. Two pyrometers may be provided, one to take the central temperature measurements and one to take the peripheral temperature measurements. Alternatively, a plurality of thermocouples can be embedded into the substrate. That said, embedding thermocouples has been found to be difficult and can be unreliable. As such, a plurality of pyrometry measurements is considered to be the better solution. In this regard, pyrometric measurements may focus on the temperature of the growing CVD diamond material. However, as the material is in good thermal contact with the underlying substrate then the temperature of the diamond material will equate to the temperature of the underlying substrate.

It has been surprisingly found that small variations in temperature across the top surface of the substrate are caused by very minor variations in the height of the gas gap under the substrate. Minor flatness variations in a rear surface of the substrate result in minor variations in the height of the gas gap and it has been found that this results in differential cooling/heating across the substrate.

While the previously described arrangements can control variations in temperature which are circumferentially symmetric, it can be more difficult to control temperature variations which are not circumferentially symmetric such as those caused by variations in the gas gap height. For example, buckling introduces non-uniformities in the temperature of the substrate which are not symmetric. Typical buckling magnitudes can be greater than 20 micron (peak to valley).

In order to solve this problem, the present inventors found that it is advantageous to ensure that the height h of the gas gap varies by no more than 200 µm, 150 µm, 100 µm, 80 µm, 60 µm, 40 µm, 20 µm, 10 µm, or 5 µm. This may be achieved, for example, by further processing the rear surface of substrates to have a very precisely defined profile which is complementary to the profile of the supporting surface of the substrate holder. For example, if the supporting surface of the substrate holder is flat, then the rear surface of the substrate should be processed to ensure that it is very precisely flat.

Accordingly, control of rear surface substrate shape by mechanical means (preferably uniform, non-directional processing, e.g. lapping rather than grinding) has been found to be advantageous. Furthermore, the supporting surface of the substrate holder may also be processed to have a precisely defined profile which is complementary to the rear surface of the substrate. Most conveniently this is flat, although other shapes can be used so long as the profile of the supporting surface of the substrate holder and the rear surface of the substrate are complementary so as to maintain a very precisely defined gas gap height. Furthermore, it is possible to intentionally profile at least a portion of the supporting surface of the substrate holder or the rear surface of the substrate to provide a controlled variation in the height of the gas gap, for example to have a smaller gas gap around the periphery of the substrate to preferentially cool the peripheral region and/or to provide electric field modifying structures. Accordingly, the height h of the gas gap may vary by no more than 200 µm, 150 µm 100 µm, 80 µm, 60 µm, 40 µm, 20 µm, 10 µm, or 5 µm across at least a central region of the substrate having a centred diameter equal to or greater than 60%, 70%, 80%, 90%, 95%, or 99% of a total diameter of the support substrate. Furthermore, the gas gap may have a central region with a first gas gap height and a peripheral region with a second gas gap height, the first gas gap height being larger than the second gas gap height.

Figure 4:
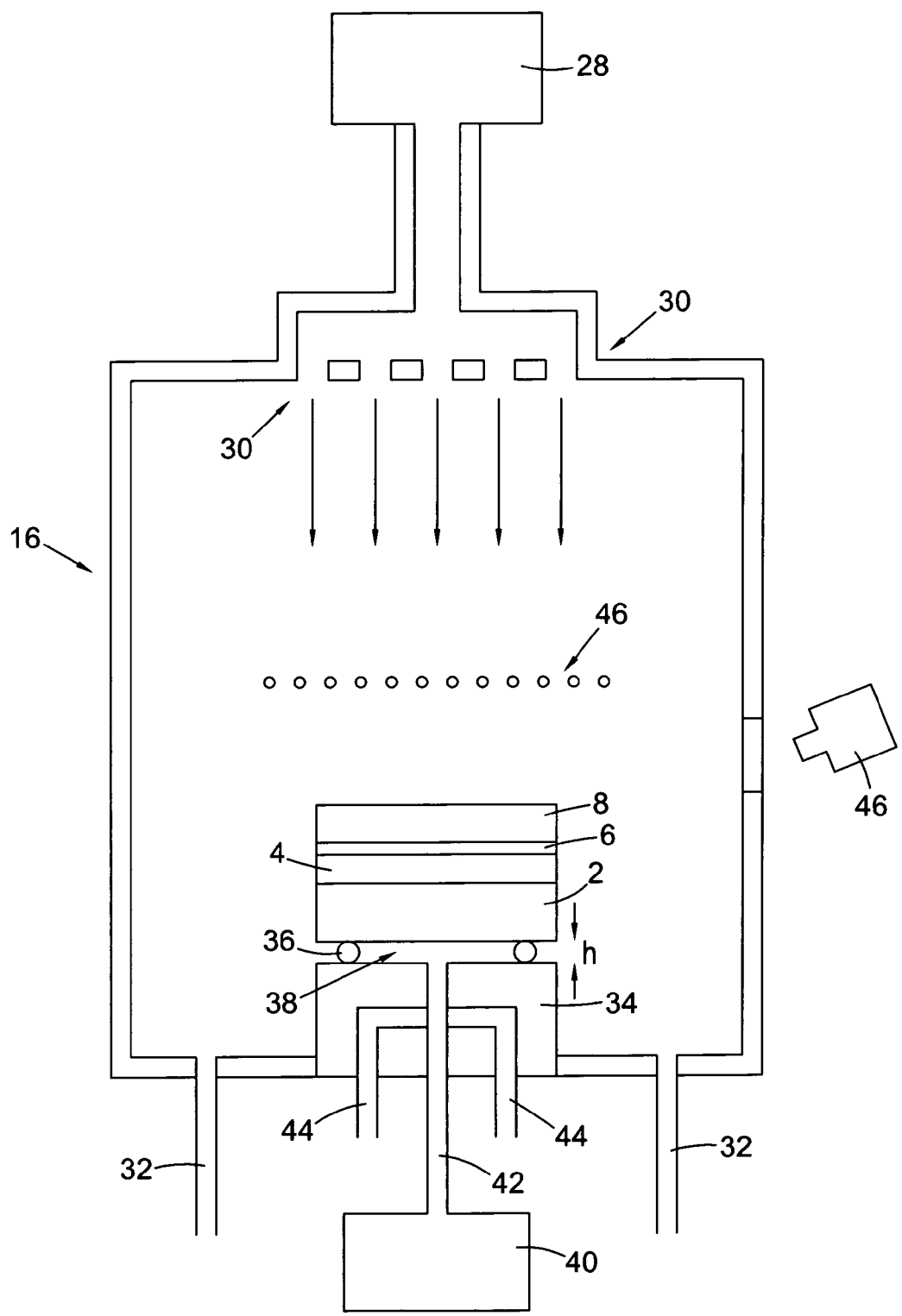
FIG. 4 illustrates a hot filament reactor for synthesis of CVD diamond material which comprises a substrate mounting stage and temperature control system used in combination with a composite substrate as illustrated in FIG. 1 for achieving precise control of the temperature across the growth surface of the composite substrate during the CVD diamond synthesis process.

A substrate and temperature control configuration as described above has been found to be advantageous for use in methods which utilize a microwave plasma reactor. However, in principle the substrate and temperature control configuration could also be used in other types of CVD diamond reactor. For example, FIG. 4 illustrates a hot filament reactor comprising a similar substrate and temperature control configuration. Many of the parts are comparable with those of the microwave plasma system previously discussed in relation to FIG. 3. These parts have been identified with like reference numerals and include: a chamber 16; a substrate holder 34; a substrate configuration 2, 4, 6 on which CVD diamond material 8 is grown; a gas flow system comprising source gases 28, one or more gas inlets 30, and one or more gas outlets 32 for feeding process gases into the plasma chamber 16 and removing them therefrom; a temperature control system comprising a liquid coolant system 44 for cooling the substrate holder 34 and a gas coolant system 40, 42 for supplying gas to a gas gap 38; and a temperature monitoring device 46. The main difference between the CVD reactors of FIGS. 3 and 4 lies in the technique used to activate the processes gases introduced into the reactor chamber. In the arrangement of FIG. 3 microwaves are coupled into the reactor chamber to dissociate process gases. In contrast, the arrangement illustrated in FIG. 4 uses an array of filaments 46 which are heated via an electric current. The hot filaments 46 dissociate process gases in order to achieve CVD diamond growth. In order to avoid edge effects around a peripheral region of the substrate, the filament array 46 may be configured to extend beyond the edge of the substrate.

The substrate temperature control system may further comprise a temperature modifying ring disposed around the substrate to modify the temperature of a peripheral region of the growth surface of the substrate. The temperature modifying ring may be formed by providing a profile in the supporting surface of the substrate holder around the substrate or by providing a separate component disposed over the substrate holder.

Figure 5:
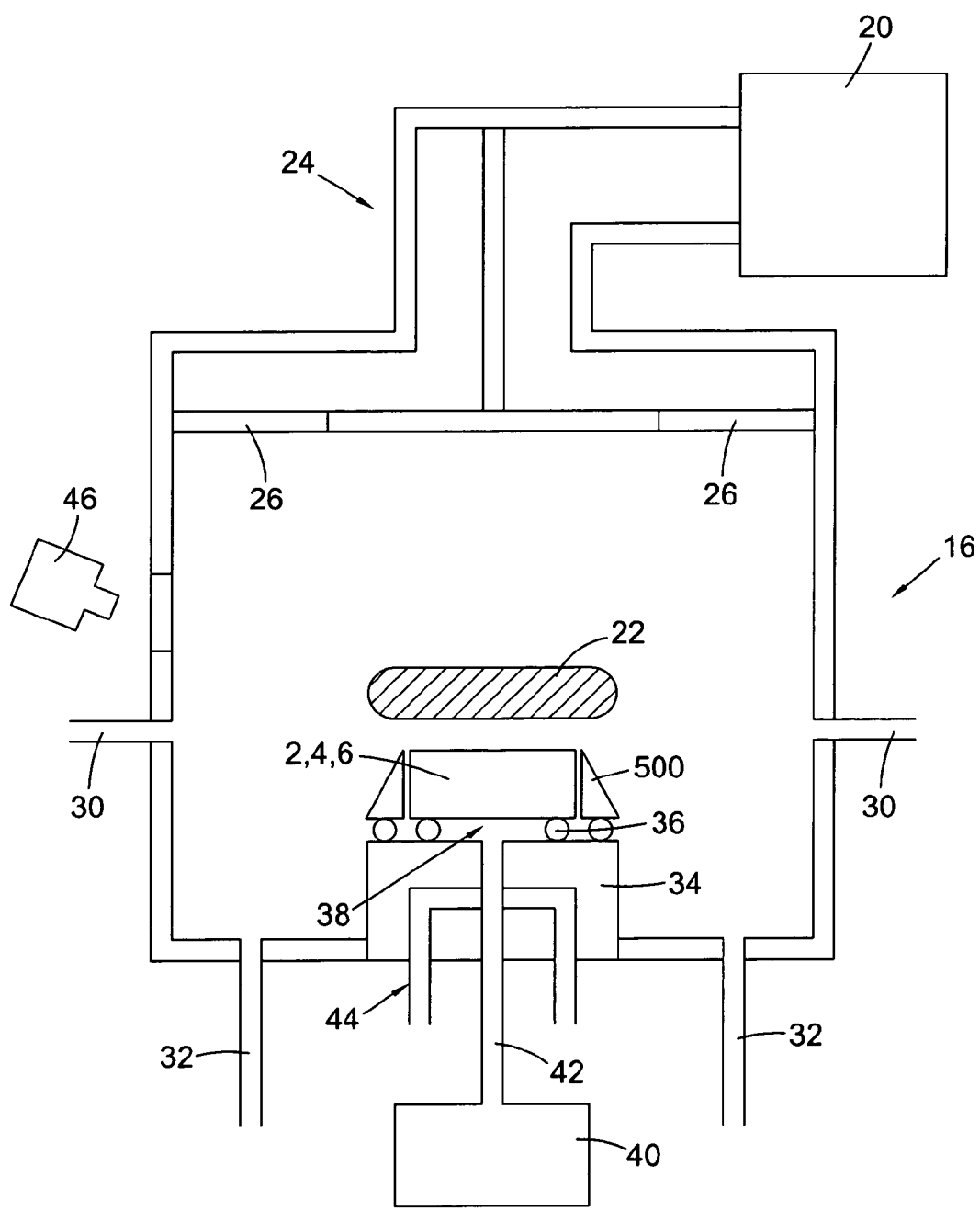
FIG. 5 illustrates a microwave plasma reactor configuration which comprises a temperature modifying ring disposed around the substrate.

FIG. 5 shows a cross-sectional view of another microwave plasma reactor configured to include a temperature modifying ring 500 disposed over the substrate holder 34 and around the substrate 2, 4, 6. The temperature modifying ring 500 is disposed on spacers in a similar manner to the substrate or supported on the substrate holder via supporting legs which can be machined into a lower surface of the temperature modifying ring to provide contact points with the substrate holder. In other respects, the arrangement illustrated in FIG. 5 is similar to that shown in FIG. 3 and comprises the following parts (like reference numerals being used to identify parts comparable with those illustrated in FIG. 3): a plasma chamber 16; a substrate holder 34; a substrate configuration 2, 4, 6 as previous illustrated in FIG. 1 on which CVD diamond material 8 is grown; a microwave generator 20 for forming a plasma 22 within the plasma chamber 16; a microwave coupling configuration 24 for feeding microwaves from the microwave generator 20 into the plasma chamber 16 via dielectric windows 26; a gas flow system comprising source gases 28, one or more gas inlets 30, and one or more gas outlets 32 for feeding process gases into the plasma chamber 16 and removing them therefrom; a temperature control system comprising a liquid coolant system 44 for cooling the substrate holder 34 and a gas coolant system 40, 42 for supplying gas to a gas gap 38; and a temperature monitoring device 46.

Figure 6:
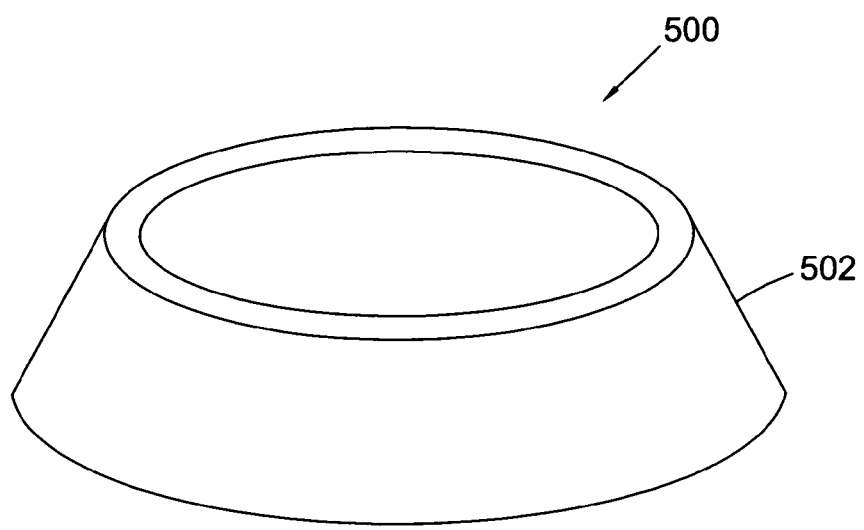
FIG. 6 shows the temperature modifying ring in more detail.

FIG. 6 shows the temperature modifying ring in more detail. The ring should be robust to the harsh thermal environment present in the plasma chamber. Advantageously the ring should have a melting point greater than 500° C. and a thermally conductivity greater than 10 $Wm^{-1}K^{-1}$. The ring is preferably metallic. Furthermore, the ring may have an electrical conductivity greater than $1 \times 10^5$ $Sm^{-1}$. Examples of suitable materials include tantalum, molybdenum, tungsten, and alloys thereof.

The ring is preferably a complete ring although it may also be possible to use a segmented ring comprising a plurality of arcuate segments. Advantageously, the ring has a sloped outer surface 502, for example, at an angle of between 20° and 80°, more preferably 40 to 60°, relative to a central axis of the ring. It has been found that if the ring has a wide top section this can decrease total delivered power density. As such, the width of a top portion of the ring may be equal to or less than 5 mm, 3 mm or 2 mm. In one configuration, the ring may be formed of a 1 mm wide vertical tantalum strip. However, it is desirable that a lower portion of the ring has a greater width to absorb power and heat up to approximately diamond growing temperature. As such, the angled cross-sectional arrangement as illustrated and described above is preferred. The temperature of the ring can be kept hot by ensuring that the contact area of the ring with the substrate holder is small, e.g. the majority of a lower surface of the ring may be spaced apart from the substrate holder and/or base of the chamber. A gap of approximately 0.5 mm under the ring may thus be provided so there is little thermal conduction between the ring and the surface over which the ring is disposed.

The temperature modifying ring performs two roles: it moves the ring of high electric field away from the substrate edge; and, being a separately heated (by plasma) and cooled (by the chamber base) item, it directly modifies the substrate edge temperature.

In light of the above, it will be evident that use of such a ring structure mounted on the substrate holder around the substrate can be advantageous for use in combination with embodiments of the present as previously described. The advantageous effects of such a ring structure may also be evident with alternative reactor arrangements.

Using reactor configurations such as those previously described, it is possible to operate at CVD diamond growth conditions suitable to obtain good growth rates and/or high quality polycrystalline diamond material while avoiding plastic deformation of the compound semiconductor material within the substrate. That is, high power and/or pressure conditions can be utilized which would otherwise cause plastic deformation of the compound semiconductor material. For example, during CVD diamond growth an operating power density at the growth surface may be equal to or greater than 0.5 $W/mm^2$, 0.75 $W/mm^2$, 1.0 $W/mm^2$, 1.25 $W/mm^2$, 1.5 $W/mm^2$, or 1.75 $W/mm^2$, 2.0 $W/mm^2$, 2.25 $W/mm^2$, 2.5 $W/mm^2$, 2.75 $W/mm^2$, 3.0 $W/mm^2$, or 3.5 $W/mm^2$. The operating power density at the growth surface may be no more than 5.0 $W/mm^2$, 4.0 $W/mm^2$, 3.0 $W/mm^2$, 2.5 $W/mm^2$, or 2.3 $W/mm^2$.

If the CVD reactor is a hot filament reactor an operating pressure within the CVD reactor during CVD diamond growth may be at least 25 Torr, 30 Torr, 35 Torr, 40 Torr, 50 Torr, 60 Torr, 70 Torr, or 80 Torr. The operating pressure may be no more than 200 Torr, 180 Torr, 150 Torr, 130 Torr, or 110 Torr. If the CVD reactor is a microwave plasma reactor an operating pressure within the CVD reactor during CVD diamond growth may be at least 80 Torr, 100 Torr, 125 Torr, 150 Torr, 175 Torr, 200 Torr, 225 Torr, 250 Torr, or 300 Torr. In this case, the operating pressure may be no more than 750 Torr, 650 Torr, 550 Torr, or 500 Torr. Furthermore, during CVD diamond growth a variation in operating pressure within the CVD reactor may be maintained to be no more than 50 Torr, 40 Torr, 30 Torr, 20 Torr, 10 Torr, 5 Torr, 2 Torr, or 1 Torr.

Uniformity of CVD diamond growth and control of temperature variations over large deposition areas can also be aided by providing a gas inlet nozzle array comprising a plurality of gas inlet nozzles disposed opposite the growth surface of the composite substrate for directing process gases towards the composite substrate during CVD diamond growth. Using such an arrangement it is possible to utilize high gas flow rates to achieve better growth rates while maintaining uniformity of CVD diamond growth and control of temperature variations over large deposition areas. For example, a total gas flow fed through the gas inlet nozzle array may be equal to or greater than 500, 750, 1000, 2000, 5000, 10000, 15000, 20000, 25000, 30000, 35000, or 40000 standard $cm^3$ per minute. Furthermore, a total gas flow fed through the gas inlet nozzle array relative to the growth surface area may be equal to or greater than 3, 10, 20, 50, 100, 200, 500, or 1000 standard $cm^3$ per $cm^2$ of the growth surface area and equal to or less than 50000, 20000, 10000, or 5000 standard $cm^3$ per $cm^2$ of the growth surface area.

Using structural arrangements and process parameters as described herein, it is possible to control the temperature difference between an edge and centre point of the growth surface of the interface layer so as to be maintained to be no more than 80° C., 60° C., 40° C., 20° C., 10° C., 5° C., or 1° C. Furthermore, the temperature of the growth surface of the interface layer can be maintained in a range 700° C. to 850° C., 700° C. to 800° C., or 725° C. to 800° C.

CVD diamond growth may be initiated by: forming a CVD synthesis atmosphere within the CVD reactor at a desired composition, pressure, and gas flow rate; and supplying power into the CVD reactor to dissociate process gases within the CVD reactor and initiate CVD diamond growth. The power supplied into the CVD reactor and/or the pressure within the CVD reactor can be increased in a uniform or stepwise manner at a controlled rate to achieve a target operating power and a target operating pressure for CVD diamond growth without exceeding a yield stress of the composite substrate.

The rate of power increase per unit area of the growth surface to achieve the target operating power for CVD diamond growth may be no more than 2.0 $W/mm^2$/min, 1.5 $W/mm^2$/min, 1.0 $W/mm^2$/min, 0.8 $W/mm^2$/min, 0.6 $W/mm^2$/min, 0.4 $W/mm^2$/min, 0.2 $W/mm^2$/min, or 0.1 $W/mm^2$/min. The rate of pressure increase to achieve the target operating pressure for CVD diamond growth may be no more than 50 Torr/min, 40 Torr/min, 30 Torr/min, 20 Torr/min, 10 Torr/min, or 5 Torr/min. Such ramp rates for the power and pressure allow a target operating power and a target operating pressure to be achieved without exceeding a yield stress of the composite substrate. Of course, if the rate of power and pressure increase is made too small then the processing can become too long and economically unfeasible. Accordingly, in practice the rate of power increase may be no less than 0.01 $W/mm^2$/min and the rate of pressure increase may be no less than 0.25 Torr/min.

Prior to initiating CVD diamond growth the CVD synthesis atmosphere can be formed within the CVD reactor using a gas purging technique in which process gases are introduced into the CVD reactor to flush out atmospheric gases and pressure is reduced within the CVD reactor to a staring pressure which is above the base pressure of the CVD reactor. This technique can be preferable when compared with the alternative which comprises evacuating the reactor chamber down to base pressure and then introducing process gases. For example, a gas purging technique has been found to be more efficient at removing atmospheric gases and other impurities from the reactor chamber prior to CVD diamond growth.

The synthesis atmosphere may have an operating composition comprising a hydrogen source gas, a carbon source gas, and nitrogen, wherein an atomic concentration of hydrogen relative to a total gas composition is in a range 80% to 99%, wherein an atomic concentration of carbon relative to a total gas composition is in a range 1% to 20%, and wherein an atomic concentration of nitrogen relative to a total gas composition may be in a range 1 ppm to 200 ppm. Adding nitrogen into the process gas can aid in achieving good growth rates while not exceeding growth temperatures which would otherwise lead to plastic deformation of the compound semiconductor. The atomic concentration of carbon within the CVD reactor can be increased in a uniform or stepwise manner at a controlled rate to achieve a target operating atomic concentration of carbon for CVD diamond growth. Furthermore, processes gas extracted from the reactor chamber may be recirculated and reused. If the process gas is recirculated then the carbon-content may need to be monitored and adjusted to account for carbon precipitation. Adjustment is not instantaneous in practice and the carbon content thus oscillates at or near the desired value rather than being constant as a measurable change in carbon content is required before an adjustment can be made.

Embodiments of the present invention can combine one or more of the aforementioned features in order to fabricate synthetic diamond coated compound semiconductor substrates in which the synthetic diamond material has high thermal conductivity, which generally requires high powers and pressures. The substrate structures and process control features described herein allow such conditions to be used without plastic deformation of the compound semiconductor material which would otherwise detrimentally affect its performance. As such, it is possible to fabricate a composite structure comprising:
- a layer of synthetic polycrystalline CVD diamond material having a thickness no less than 40 μm and preferably in a range 40 μm to 150 μm, 70 μm to 130 μm, 80 μm to 120 μm, or 90 μm to 110 μm;
- an interface layer disposed on the layer of synthetic polycrystalline CVD diamond material; and
- a layer of single crystal compound semiconductor disposed on the interface layer, the layer of single crystal compound semiconductor having a thickness no less than 0.01 μm and preferably in a range 0.01 to 100 μm, 0.01 to 50 μm, 0.01 to 10 μm, 0.01 to 5 μm, 0.05 to 3 μm, or 0.1 to 2 μm,
- wherein the interface layer has a thickness no more than 15 μm, 10 μm, 5 μm, 3 μm, 1 μm, 100 nm, 50 nm, 20 nm, 10 nm, or 5 nm,
- wherein the layer of synthetic polycrystalline CVD diamond material has a thermal conductivity of at least 600 $Wm^{-1}K^{-1}$, 800 $Wm^{-1}K^{-1}$, 1000 $Wm^{-1}K^{-1}$, 1200 $Wm^{-1}K^{-1}$, or 1400 $Wm^{-1}K^{-1}$, and
- wherein the layer of single crystal compound semiconductor has a charge mobility no less than 1000 $cm^2V^{-1}s^{-1}$, 1200 $cm^2V^{-1}s^{-1}$, 1400 $cm^2V^{-1}s^{-1}$, 1600 $cm^2V^{-1}s^{-1}$, 1800 $cm^2V^{-1}s^{-1}$, or 2000 $cm^2V^{-1}s^{-1}$.

While such charge mobilities of compound semiconductor layers have previously been achieved on non-diamond substrates and may be achieved on diamond substrates when the semiconductor layer is not in good thermal contact with the diamond substrate layer, the combination of a thick, high thermal conductivity diamond layer in combination with a high quality, low strain compound semiconductor layer, with both layers disposed in very close proximity to provide good thermal contact has proved difficult to date for the reasons explained in this specification.

While it is desirable to provide very high thermal conductivity in the diamond layer and very high charge mobility in the compound semiconductor layer, in practice the thermal conductivity of the diamond layer will likely be under 2200 $Wm^{-1}K^{-1}$ and the charge mobility of the compound semiconductor layer will likely be under 2500 $cm^2V^{-1}s^{-1}$.

The compound semiconductor may comprise group III and group V elements. For example, the semiconductor may comprise a group III nitride such as InN, GaN, AlN, BN, or combinations thereof.

The composite substrate structures may be utilized in a number of different device applications including high frequency devices, high brightness LEDs and LDs, and for high voltage (power) devices.

While this invention has been particularly shown and described with reference to preferred embodiments, it will be understood to those skilled in the art that various changes in form and detail may be made without departing from the scope of the invention as defined by the appendant claims.

Work relating to this invention has received funding from the [European Community's] [European Atomic Energy Community's] Seventh Framework Programme ([FP7/2007-2013] [FP7/2007-2011]) under grant agreement n° [214610].

The invention claimed is:

1. A method of fabricating a synthetic diamond coated compound semiconductor substrate, the method comprising:
    loading a composite substrate into a chemical vapour deposition (CVD) reactor, the composite substrate comprising a single crystal carrier wafer, a layer of single crystal compound semiconductor epitaxially grown on the carrier wafer, and an interface layer disposed on the layer of compound semiconductor, the interface layer forming a growth surface suitable for growth of synthetic diamond material thereon via a CVD technique; and
    growing a layer of CVD diamond material on the growth surface of the interface layer;
    wherein during growth of CVD diamond material a temperature difference at the growth surface between an edge and a centre point thereof is maintained to be no more than 80° C.;
    wherein the carrier wafer has an aspect ratio, defined by a ratio of thickness to width, of no less than 0.25/100;
    wherein the width of the carrier wafer is no less than 90 mm and no more than 400 mm;
    wherein the thickness of the carrier wafer is no less than 600 μm and no more than 5 mm;
    wherein the carrier wafer is formed of one of silicon, silicon carbide, and sapphire;
    wherein the thickness of the layer of CVD diamond material is in a range 50 μm to 150 μm;
    wherein the interface layer has a thickness no more than 50 nm; and
    wherein growth surface of the interface layer has a surface roughness $R_a$ in the range 1 nm to 1 μm, 1 nm to 500 nm, 10 nm to 500 nm, 10 nm to 200 nm, or 10 nm to 100 nm.

2. A method according to claim 1, wherein the aspect ratio of the carrier wafer is no less than 0.60/100, 0.70/100, 0.80/100, 0.90/100, or 1.0/100.

3. A method according to claim 1, wherein the width of the carrier wafer is no less than 110 mm, 130 mm, or 150 mm.

4. A method according to claim 1, wherein the carrier wafer is in the form of a cylindrical disk and the width is equal to a diameter of the cylindrical disk.

5. A method according to claim 1, wherein the thickness of the carrier wafer is no less than 725 μm, 850 μm, 975 μm, 1.2 mm, or 1.45 mm.

6. A method according to claim 1, wherein the layer of single crystal compound semiconductor has a thickness in a range 0.01 to 100 μm, 0.01 to 50 μm, 0.01 to 10 μm, 0.01 to 5 μm, 0.05 to 3 μm, or 0.1 to 2 μm.

7. A method according to claim 1, wherein the interface layer has a thickness no more than 20 nm, 10 nm, or 5 nm.

8. A method according to claim 1, wherein a ratio of CVD diamond layer thickness to carrier wafer thickness may lie in a range 0.03 to 1.5, 0.05 to 1.3, 0.1 to 1.0, or 0.3 to 0.7.

9. A method according to claim 1, wherein the layer of CVD diamond material is grown to a thickness in the range: 70 μm to 130 μm; 80 μm to 120 μm, or 90 μm to 110 μm.

10. A method according to claim 1, wherein composite substrate has a thickness variation no more than 200 μm, 150 μm, 100 μm, 80 μm, 60 μm, 40 μm, 20 μm, 10 μm, or 2 μm.

11. A method according to claim 1, wherein the temperature difference between the edge and centre point of the growth surface of the interface layer is maintained to be no more than 60° C., 40° C., 20° C., 10° C., 5° C., or 1° C.

12. A method according to claim 1, wherein the temperature of the growth surface of the interface layer is maintained in a range 700° C. to 850° C., 700° C. to 800° C., or 725° C. to 800° C.

13. A method according to claim 1, wherein during CVD diamond growth an operating power density at the growth surface is equal to or greater than 0.5 W/mm$^2$, 0.75 W/mm$^2$, 1.0 W/mm$^2$, 1.25 W/mm$^2$, 1.5 W/mm$^2$, or 1.75 W/mm$^2$, 2.0 W/mm$^2$, 2.25 W/mm$^2$, 2.5 W/mm$^2$, 2.75 W/mm$^2$, 3.0 W/mm$^2$, or 3.5 W/mm$^2$.

14. A method according to claim 13, wherein the operating power density at the growth surface is no more than 5.0 W/mm$^2$, 4.0 W/mm$^2$, 3.0 W/mm$^2$, 2.5 W/mm$^2$, or 2.3 W/mm$^2$.

15. A method according to claim 1, wherein the CVD reactor is a hot filament reactor and an operating pressure within the CVD reactor during CVD diamond growth is at least 25 Torr, 30 Torr, 35 Torr, 40 Torr, 50 Torr, 60 Torr, 70 Torr, or 80 Torr.

16. A method according to claim 1, wherein the CVD reactor is a microwave plasma reactor and an operating pressure within the CVD reactor during CVD diamond growth is at least 80 Torr, 100 Torr, 125 Torr, 150 Torr, 175 Torr, 200 Torr, 250 Torr, or 300 Torr.

17. A method according to claim 1, wherein a variation in operating pressure within the CVD reactor during CVD diamond growth is maintained to be no more than 50 Torr, 40 Torr, 30 Torr, 20 Torr, 10 Torr, 5 Torr, 2 Torr, or 1 Torr.

18. A method according to claim 1, wherein the CVD reactor comprises a gas inlet nozzle array comprising a plurality of gas inlet nozzles disposed opposite the growth surface of the composite substrate for directing process gases towards the composite substrate during CVD diamond growth.

19. A method according to claim 1, wherein CVD diamond growth is initiated by:
forming a CVD synthesis atmosphere within the CVD reactor at a desired composition, pressure, and gas flow rate; and
supplying power into the CVD reactor to dissociate process gases within the CVD reactor and initiate CVD diamond growth,
wherein the power supplied into the CVD reactor and/or the pressure within the CVD reactor is increased in a uniform or stepwise manner at a controlled rate to achieve a target operating power and a target operating pressure for CVD diamond growth without exceeding a yield stress of the composite substrate.

20. A method according to claim 19, wherein the rate of power increase per unit area of the growth surface to achieve the target operating power for CVD diamond growth is no more than 2.0 W/mm$^2$/min, 1.5 W/mm$^2$/min, 1.0 W/mm$^2$/min, 0.8 W/mm$^2$/min, 0.6 W/mm$^2$/min, 0.4 W/mm$^2$/min, 0.2 W/mm$^2$/min, or 0.1 W/mm$^2$/min.

21. A method according to claim 19, wherein the rate of pressure increase to achieve the target operating pressure for CVD diamond growth is no more than 50 Torr/min, 40 Torr/min, 30 Torr/min, 20 Torr/min, 10 Torr/min, or 5 Torr/min.

22. A method according to claim 1, wherein an atomic concentration of carbon within the CVD reactor is increased in a uniform or stepwise manner at a controlled rate to achieve a target operating atomic concentration of carbon for CVD diamond growth.

23. A method of fabricating a synthetic diamond coated compound semiconductor substrate, the method comprising:
loading a composite substrate into a chemical vapour deposition (CVD) reactor, the composite substrate comprising a single crystal carrier wafer, a layer of single crystal compound semiconductor epitaxially grown on the carrier wafer, and an interface layer disposed on the layer of compound semiconductor, the interface layer forming a growth surface suitable for growth of synthetic diamond material thereon via a CVD technique; and
growing a layer of CVD diamond material on the growth surface of the interface layer;
wherein during growth of CVD diamond material a temperature difference at the growth surface between an edge and a centre point thereof is maintained to be no more than 80° C.;
wherein the carrier wafer has an aspect ratio, defined by a ratio of thickness to width, of no less than 0.25/100;
wherein the width of the carrier wafer is no less than 90 mm and no more than 400 mm;
wherein the thickness of the carrier wafer is no less than 600 μm and no more than 5 mm;
wherein the carrier wafer is formed of one of silicon, silicon carbide, and sapphire;
wherein the thickness of the layer of CVD diamond material is in a range 50 μm to 150 μm;
wherein the interface layer has a thickness no more than 50 nm; and
wherein growth surface of the interface layer has a surface flatness variation no more than 100 μm, 75 μm, 50 μm, 40 μm, 30 μm, 20 μm, 10 μm, 5 μm, or 1 μm.

24. A method of fabricating a synthetic diamond coated compound semiconductor substrate, the method comprising:
loading a composite substrate into a chemical vapour deposition (CVD) reactor, the composite substrate comprising a single crystal carrier wafer, a layer of single crystal compound semiconductor epitaxially grown on the carrier wafer, and an interface layer disposed on the layer of compound semiconductor, the interface layer forming a growth surface suitable for growth of synthetic diamond material thereon via a CVD technique; and
growing a layer of CVD diamond material on the growth surface of the interface layer;
wherein during growth of CVD diamond material a temperature difference at the growth surface between an edge and a centre point thereof is maintained to be no more than 80° C.;
wherein the carrier wafer has an aspect ratio, defined by a ratio of thickness to width, of no less than 0.25/100;
wherein the width of the carrier wafer is no less than 90 mm and no more than 400 mm;
wherein the thickness of the carrier wafer is no less than 600 μm and no more than 5 mm;
wherein the carrier wafer is formed of one of silicon, silicon carbide, and sapphire;
wherein the thickness of the layer of CVD diamond material is in a range 50 μm to 150 μm;
wherein the interface layer has a thickness no more than 50 nm; and
wherein the carrier wafer has a rear surface flatness variation no more than 100 μm, 75 μm, 50 μm, 40 μm, 30 μm, 20 μm, 10 μm, 5 μm, or 1 μm.

25. A method of fabricating a synthetic diamond coated compound semiconductor substrate, the method comprising:
loading a composite substrate into a chemical vapour deposition (CVD) reactor, the composite substrate comprising a single crystal carrier wafer, a layer of single crystal compound semiconductor epitaxially grown on the carrier wafer, and an interface layer disposed on the layer of compound semiconductor, the interface layer forming a growth surface suitable for growth of synthetic diamond material thereon via a CVD technique; and growing a layer of CVD diamond material on the growth surface of the interface layer;

wherein during growth of CVD diamond material a temperature difference at the growth surface between an edge and a centre point thereof is maintained to be no more than 80° C.;

wherein the carrier wafer has an aspect ratio, defined by a ratio of thickness to width, of no less than 0.25/100;

wherein the width of the carrier wafer is no less than 90 mm and no more than 400 mm;

wherein the thickness of the carrier wafer is no less than 600 µm and no more than 5 mm;

wherein the carrier wafer is formed of one of silicon, silicon carbide, and sapphire;

wherein the thickness of the layer of CVD diamond material is in a range 50 µm to 150 µm;

wherein the interface layer has a thickness no more than 50 nm; and wherein a CVD synthesis atmosphere is formed within the CVD reactor using a gas purging technique in which process gases are introduced into the CVD reactor to flush out atmospheric gases and pressure is reduced within the CVD reactor to a staring pressure which is above the base pressure of the CVD reactor.

* * * * *